United States Patent
Yatsuda et al.

(10) Patent No.: US 7,019,334 B2
(45) Date of Patent: Mar. 28, 2006

(54) LED LAMP FOR LIGHT SOURCE OF A HEADLAMP

(75) Inventors: Yasushi Yatsuda, Tokyo (JP); Takashi Ebisutani, Tokyo (JP); Teruo Koike, Tokyo (JP); Takuya Kushimoto, Tokyo (JP); Ryotaro Owada, Tokyo (JP); Masafumi Ohno, Tokyo (JP); Takashi Futami, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 10/662,374

(22) Filed: Sep. 16, 2003

(65) Prior Publication Data

US 2004/0251469 A1 Dec. 16, 2004

(30) Foreign Application Priority Data

Jun. 13, 2003 (JP) ............................. 2003-169182

(51) Int. Cl.
*H01L 29/22* (2006.01)
*H01J 1/62* (2006.01)

(52) U.S. Cl. .................. 257/98; 257/99; 257/100; 313/492; 313/502; 362/507; 362/516

(58) Field of Classification Search .......... 257/98–100; 313/485, 512, 501–503, 242, 492; 362/507, 362/512, 516

See application file for complete search history.

(56) References Cited

U.S. PATENT DOCUMENTS

| 6,038,387 A * | 3/2000 | Machida ........................ 703/2 |
| 6,441,943 B1 * | 8/2002 | Roberts et al. ............. 359/267 |
| 6,565,247 B1 * | 5/2003 | Thominet .................... 362/545 |
| 6,639,360 B1 * | 10/2003 | Roberts et al. ............. 313/512 |
| 2003/0230757 A1 * | 12/2003 | Suehiro et al. ............... 257/99 |

* cited by examiner

*Primary Examiner*—Minh-Loan Tran
(74) *Attorney, Agent, or Firm*—Cermak & Kenealy LLP

(57) ABSTRACT

Whereas incandescent light bulbs and other similar light sources known in the prior art emit light in all directions, LED lamps emit light in a single direction only, and this is manifested in the problem of being unable to achieve light distribution characteristics satisfied by conventional headlamp designs. The present invention realizes an LED lamp for a light source of a headlamp disposing an LED chip 2 in the vicinity of the focus of a projection means and providing a shielding member 7 covering a portion of the LED chip 2 in a formation allowing a light distribution characteristic suitable for a vehicle front-illumination light to be obtained when light from the LED chip 2 is magnified and projected in an illumination direction by a projection lens 10 or the like constituting the projection means; accordingly, accurate light distribution characteristics can be obtained in a simple manner by projecting in the illumination direction using the projection lens 10.

5 Claims, 4 Drawing Sheets

US 7,019,334 B2

LED LAMP FOR LIGHT SOURCE OF A HEADLAMP

BACKGROUND OF THE INVENTION

1. Field of the Invention

The present invention relates to LED lamps, and in particular, to the configuration of LED lamps used as light sources in vehicle lights. Furthermore, it relates to the configuration of an LED lamp suitable for use as a light source in a vehicle lamp for illumination purposes that has not previously been put to use as headlamps (or headlights), auxiliary headlamps (or fog lights), or the like.

2. Detailed Description of the Prior Art

When LED lamps are used as a light source in flashlights and other similar lamps for the purpose of illumination in the prior art, a large LED chip is housed in a large package and light amount is obtained by, for example, applying a current of between several ten and several hundred milliamperes. Simultaneously, as the package is made large in size, deterioration or breakage of the LED chip as a result of overheating is prevented by effectively conducting the heat emitted in the LED chip to the outside when it is lit and discharging it to the atmosphere or the like. (For example, see Patent Document 1)

Patent Document 1

The Japanese Patent Laid-Open No. 2000-150968 (Paragraph 0011 through Paragraph 0034, FIG. 1)

Nevertheless, when a light fixture using an LED lamp as a light source is employed as a vehicle lamp fixture for a headlamp or the like, strict light distribution characteristics are set forth in relevant standards and other regulations with regard to prevent the drivers of oncoming vehicles from being dazzled by the light directed forwards. Furthermore, the configuration of lamps for the headlamp or the like is established in consideration of incandescent light bulbs and other similar items emitting light flux uniformly in almost all directions. Consequently, problems exist in that light distribution characteristics and the like cannot be satisfied by simply replacing the lamp with an LED lamp radiating light in a single direction in a relatively large amount.

SUMMARY OF THE INVENTION

As a tangible means of resolving the problems known in the prior art, the present invention realizes an LED lamp for a light source of a headlamp characterized in that an LED chip or a white LED light emission portion comprising an LED lamp and fluorophor is disposed in the vicinity of the focus of a projection means, and a shielding member covering a portion of the white LED light emission portion is provided in a formation allowing a light distribution characteristic suitable for a vehicle headlamp to be obtained when light from the white LED light emission portion is magnified and projected in an illumination direction by the projection means. Accordingly, the problems are resolved by enabling the regulated light distribution characteristics to be accurately and easily achieved even when an LED lamp is used as a light source.

BRIEF DESCRIPTION OF THE DRAWINGS

These and others and advantages of the present invention will become clear from following description with reference to the accompanying drawing, wherein.

REFERENCES

Figure 1:
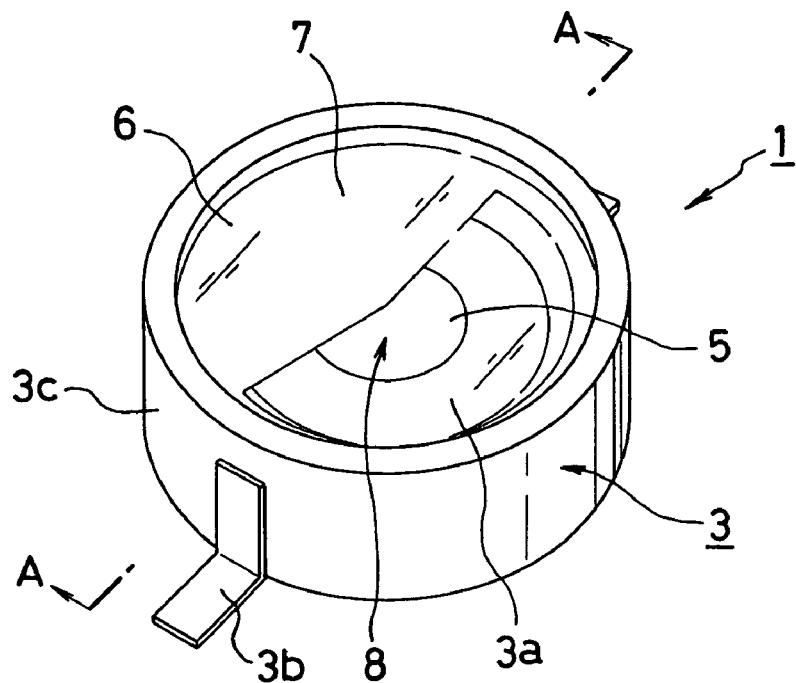
FIG. 1 is a perspective view showing an LED lamp for a light source of a headlamp according to a preferred embodiment of the present invention.

1: LED lamp for a light source of a headlamp
2: LED chip
3: Base unit
3a: Base
3b: Lead frame
3c: Insulating layer
4: Metal wire
5: Fluorophor
6: Window glass member
7: Shielding member
7a: Serrated section
8: White LED light emission portion
9: Silicone gel
10: Projection lens
11: Reflector
12: $SiO_2$ film

DETAILED DESCRIPTION OF THE PREFERRED EMBODIMENT

Figure 2:
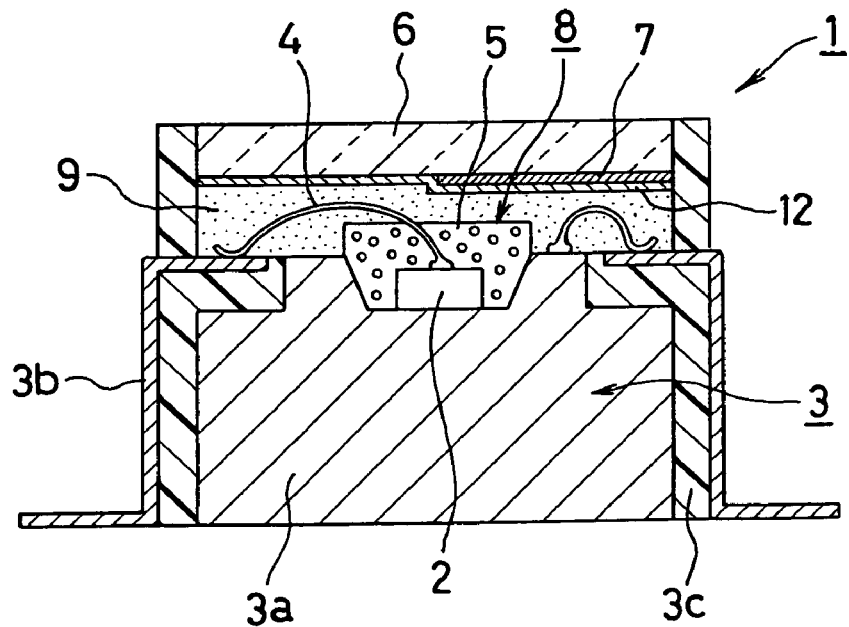
FIG. 2 is a cross-section view on A—A of FIG. 1.

Hereinafter, the present invention will be described by way of preferred embodiments thereof with reference to the accompanying drawings. The part indicated by reference 1 in FIG. 1 and FIG. 2 is an LED lamp for a light source of a headlamp according to the present invention (hereinafter referred to as an "LED lamp 1"), and in the LED lamp 1, an LED chip 2 is mounted on a base unit 3.

The base unit 3 provides a base 3a formed with a metal member of copper or some other metal excellent in heat conduction and a lead frame 3b also formed with a metal member. The base 3a and the lead frame 3b are insulated by an insulating layer 3c formed with a resin member or another similar insulating member. The LED chip 2 mounted on the base 3a is wired to the lead frame 3b using a metal wire 4 or the equivalent, so the lighting can be carried out using power supplied from the exterior.

Considering the conditions to be satisfied for usage of the LED lamp 1 as a light source for a headlamp, it can be seen that the regulated color of the lamp is white or monochromatic yellow. Although white light is used more often, no LED chip 2 that can directly emit white light actually exists, and fluorophor 5 are used in combination in order to obtain white light.

As a first method of doing so, an LED chip 2 generating blue light and a wavelength conversion member such as fluorophor 5 emitting yellow light are combined, and white light is obtained by mixing the blue light emitted directly from the LED chip 2 with the yellow light emitted from the fluorophor 5 excited by the light from the LED chip 2. As a second method, furthermore, the LED chip 2 emitting ultraviolet light is combined with fluorophor 5 emitting light of the three primaries red (R), green (G), and blue (B). In this case, the light emitted directly from the LED chip 2 is not used as illumination light, and the illumination light from the LED lamp 1 comprises the light emitted from the fluorophor 5.

The present invention will hereinafter be described in terms of a light source for a headlamp using a white LED light emission portion 8 combining an LED chip 2 and fluorophor 5; nevertheless, in situations where it is required that the lamp color be yellow, for example, it is possible for the light emitted directly from the LED chip 2 to be used as the light for the light source. In such a situation, however, it is also possible for the present invention to be implemented, and it is sufficient for the white LED light emission portion 8 to be replaced by the LED chip 2 in this case.

Parts such as the LED chip 2, a metal wire 4, and fluorophor 5 are mechanically weak and do not have good resistance to humidity and other similar factors. Accordingly, these parts are covered by a lens-shaped member formed from transparent resin or the like or by a window glass member (the accompanying drawings show an example in which a window glass member 6 is used), and through the action of this part and the base 3a, are sealed with respect to outside air. Thus, the above-described parts are prevented from breaking as a result of contact with the other parts, deteriorating as a result of humidity, and other similar factors. Furthermore, it is preferable to fill inert gas, silicone gel, or the like (this explanation assumes usage of silicone gel 9) into the space between the lens-shaped member or the window glass member and the white LED light emission portion 8.

In addition, the LED lamp 2 according to the present invention provides a shielding member 7. Furthermore, this shielding member 7 covers a portion of the fluorophor 5, and for example, when light emitted from the fluorophor 5 is projected in the illumination direction by a projection lens or the like, allows a light distribution pattern for passing or any other desired light pattern to be obtained.

Accordingly, both the window glass member 6 and the shielding member 7 are disposed more forward than the fluorophor in the illumination direction, and since the window glass member 6 is transparent and the shielding member 7 is opaque, either of these parts can be disposed forward of the other. Furthermore, the shielding member 7 can be freely formed, for example, using the inner and outer surfaces of the window glass member 6 with an opaque paint covering or vapor deposition of metallic member.

When a headlamp using the LED lamp 1 as a light source is used to provide light for an infrared night-vision device, a member transmitting the infrared light and shielding visible light-is used for the window glass member 6, and in terms of the shielding member 7, it is sufficient to use a member shielding beam of light from infrared through visible light. Moreover, when the shielding member 7 is a vapor deposited film with the metallic member, deterioration as a result of oxidation and other similar factors are considered possible, and therefore, it is acceptable to provide protection by covering with a $SiO_2$ film as indicated by reference 12 in FIG. 2.

Figure 3:
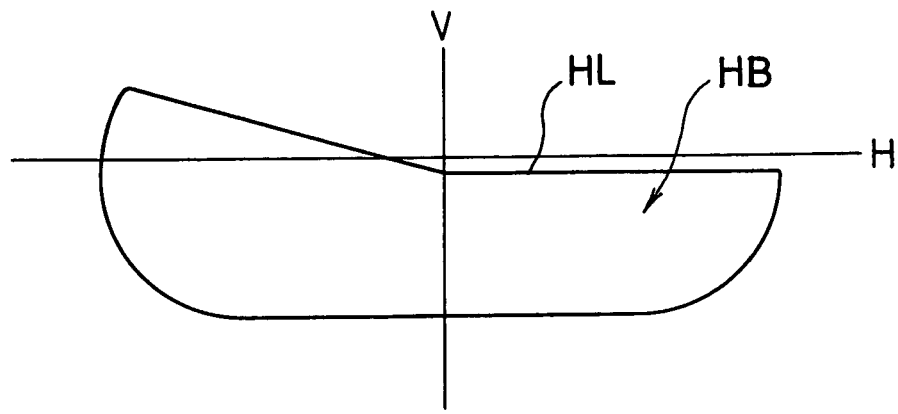
FIG. 3 is an explanatory drawing showing a typical passing light distribution characteristic obtained by the present invention.

Reference HB from FIG. 3 indicates a typical passing light distribution pattern for left-hand drive situations. In this passing light distribution pattern HB, the half on the right of the vehicle centerline constitutes a light distribution pattern containing no upward directed light in order to prevent the drivers of oncoming vehicles from being dazzled. On the other hand, the half on the left of the vehicle centerline contains a section called an "elbow" in which upward directed light increases towards the left at an angle of 15.degree. in order to allow traffic signs and the like on the road side to be easily identified.

Figure 4:
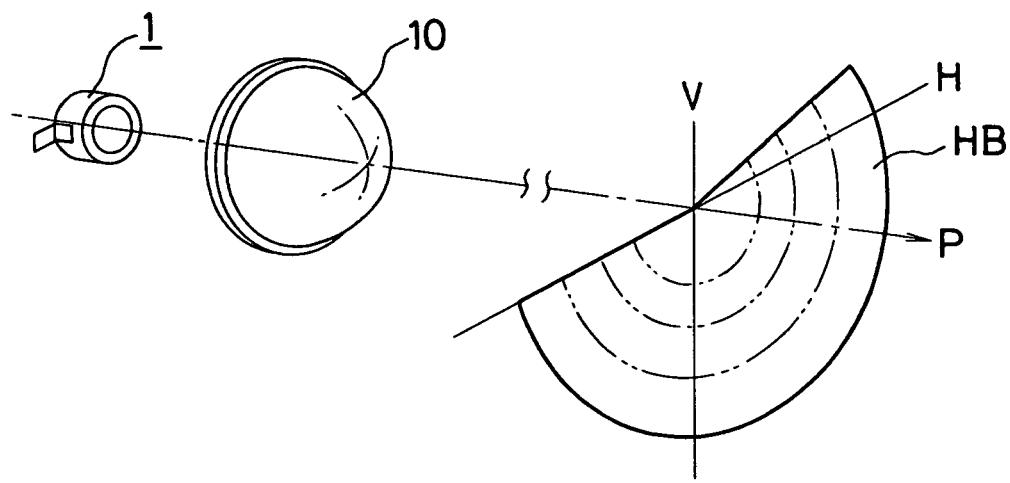
FIG. 4 is an explanatory drawing showing an embodiment of the LED lamp for the light source of the headlamp according to the present invention when a projection lens is assembled thereto.

In the present invention, the shape of the portion of the fluorophor 5 not covered by the shielding member 7 is made similar to that of the above-mentioned passing light distribution pattern HB. Moreover, as shown in FIG. 4, the shape of the fluorophor 5 obtained in this way is projected in the illumination direction P by a projection lens 10 to obtain the passing light distribution pattern HB. In order to ensure that highest intensity is in the front horizontal direction so that good long-distance visibility can be assured, when the LED chip 2 is covered by the shielding member 7, this is performed at the point of highest intensity or at a position in the vicinity thereof.

Horizontal and vertical inversion occurs after projection by the projection lens 10, and therefore, the LED lamp 1 is mounted in the headlamp in a 180.degree.-rotated condition, and when projection is carried out by the projection lens 10 in this condition, an erect image of the passing light distribution pattern HB can be obtained. Furthermore, by modifying the formation of the shielding member 7, light distribution patterns without an elbow, light distribution patterns for driving, and other types of light distribution pattern can be freely formed.

As a further description of the shielding member 7, it can be stated that since the shielding member 7 shields the light from the LED chip 2, when half thereof is covered, the quantity of light is halved, and in this way, loss occurs with respect to the quantity of light emitted from the LED chip 2. The results of studies by the inventors show that the treatment of the surface at least opposing the LED chip 2 has a minor effect on the shape of the light distribution characteristic formed after projection.

That is to say, when the surface of the shielding member 7 (i.e., the surface facing the projection lens 10) reflects light, this light is re-projected by the projection lens 10 and there is a high probability that formation of the light distribution pattern will be adversely affected. Therefore, it is preferable to provide non-reflection treatment of a color such as black. Nevertheless, a mirror finish is provided to the rear surface, and even when the light emitted from the LED chip 2 is reflected, this returns only to the LED chip 2 side and has no substantial effect on the formation of the boundary between the fluorophor 5 and the shielding member 7, or in other words, on the formation of the shape of the light distribution characteristic.

Figure 5:
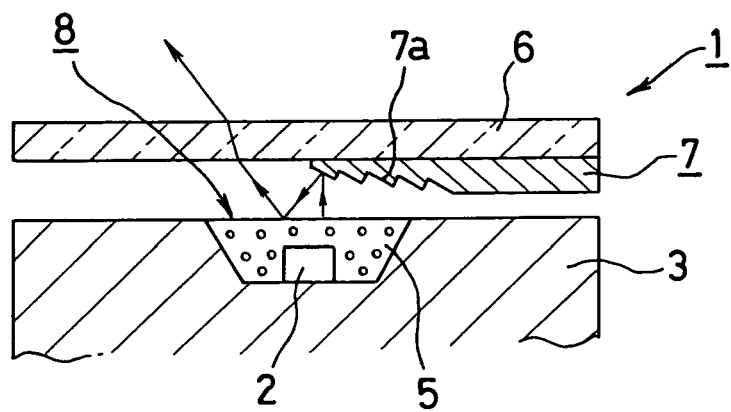
FIG. 5 is a cross-section view showing a typical configuration of a shielding member in the LED lamp for a light source of a headlamp according to the present invention.

The light reflected by the rear surface of the shielding member 7 is returned to the inside of the fluorophor 5. Therefore, by providing, as shown in FIG. 5, a mirror finish on the rear surface of the shielding member 7 and, for example, a serrated section 7a emitting light to be reflected in the direction of the non-covered portion of the fluorophor 5, the brightness of light from the fluorophor 5 can be improved. In other words, the light reaching the rear surface of the shielding member 7 can be collected for use as illumination light, and it has been confirmed by trial manufacture and measurement by the inventors that the quantity of light increases by at least 15%.

Furthermore, results of simultaneous studies carried out by the inventors regarding the shielding member 7 showed that it is preferable to perform projection with the focus of the projection lens 10 aligned with the shielding member 7 in order to enable more precise formation of the shape of the light distribution characteristic. Moreover, when brightness is required within the light distribution characteristic, it is preferable to perform projection with the focus of the projection lens 10 aligned with the white LED light emission portion 8 (or LED chip 2 when the lamp color is yellow). If the LED chip 2 and the shielding member 7 are disposed in mutual proximity, the focus is substantially aligned with both parts, and this condition is favorable in terms of both shape and brightness. Furthermore, a gap between both of these parts of 2 mm or less is preferable, and more favorable results can be obtained by reducing this gap to 1 mm or less.

Figure 6:
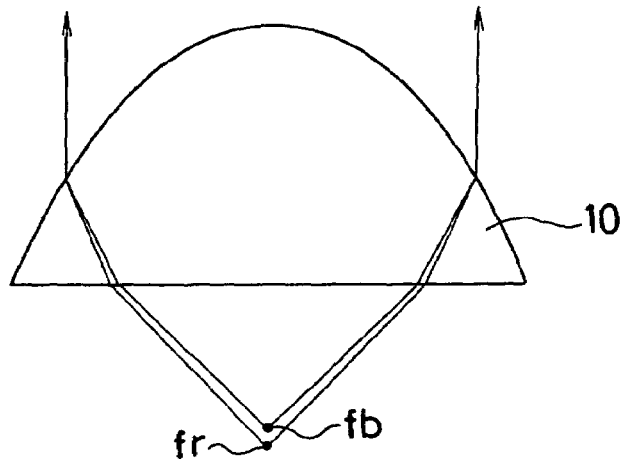
FIG. 6 is an explanatory drawing showing typical chromatic aberration occurring in the projection lens.

In situations as explained above where the white LED light emission portion 8 covered by the shielding member 7 is projected by the projection lens 10, a single plano-convex lens is often used for the projection lens 10. Therefore, as shown in FIG. 6, a difference occurs in the position of, for example, the focus fb for blue light and the focus fr for red light, resulting in what is known as chromatic aberration.

Figure 7:
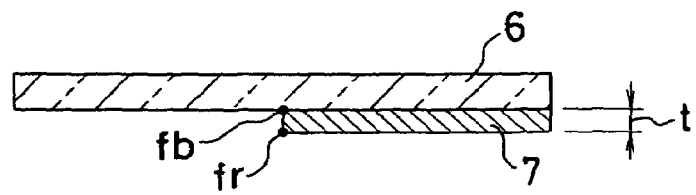
FIG. 7 is a cross-section view showing another typical configuration of the shielding member in the LED lamp for the light source of the headlamp according to the present invention.

In such a case, if the shielding member 7 is disposed closer to any one of such foci, coloration occurs in the terminator HL (see FIG. 3) corresponding to the portion of the passing light distribution pattern HB in which the shape of the shielding member 7 is projected, and it is therefore impossible to satisfy the regulation requiring that the light color be monochromatic. As a means of solving this problem, if the thickness t of the shielding member 7 is, for example, made to extend from the focus fb for the blue light to the focus fr for the red light as shown in FIG. 7, and a plurality of colors are emitted on the projected terminator HL, the color of the light emitted when this plural colors are mixed is close to white. Thus, it is possible to eliminate a sense of specific colors being present.

Figure 8:
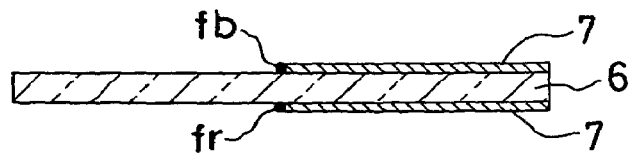
FIG. 8 is a cross-section view showing a further typical configuration of the shielding member in the LED lamp for the light source of the headlamp according to the present invention.

Alternatively, as shown in FIG. 8, two or more thin shielding members 7 are provided, and for example, the front and rear surfaces of the window glass member 6 are used; furthermore, one of these thin shielding members 7 is disposed at the position of the focus fb for the blue light, and the other is disposed at the position of the focus fr for the red light. In accordance with this configuration, the blue light and the red light having a substantially complimentary-color relationship are mixed on the projected terminator HL of the passing light distribution pattern HB, and in the same way as explained above for the thick shielding member 7, it is possible to eliminate a sense of specific colors being present.

As a further description of the shielding member 7, it can be stated that in addition to the chromatic aberration described above, aberration factors such as spherical aberration, astigmatism, coma, field curvature, and distortion occur in the projection lens 10. As a result of these aberration factors, shape distortion or focus displacement occurs when the shape of the white LED light emission portion 8 is projected.

Therefore, if the shielding member 7 is formed with the same curvature as the curvature in the focus surface of the projection lens 10 in order to countermeasure field curvature for example, it is possible to obtain a sharp terminator HL extending from the center to the right and left (provided that spherical aberration, astigmatism, and coma have no effect). Furthermore, in response to distortion and other aberration factors that cause shapes to become distorted, it is sufficient to correct the shielding member 7 in such a way that the desired shape of the passing light distribution pattern is obtained after projection.

As explained above, all aberration factors can be resolved by methods such as thickening, curving, or transforming of the shielding member; however, no detailed explanation of these methods will be provided herein as such information is already publicly known in terms of a wide range of projector-type lamps using projector lenses 10.

Figure 9:
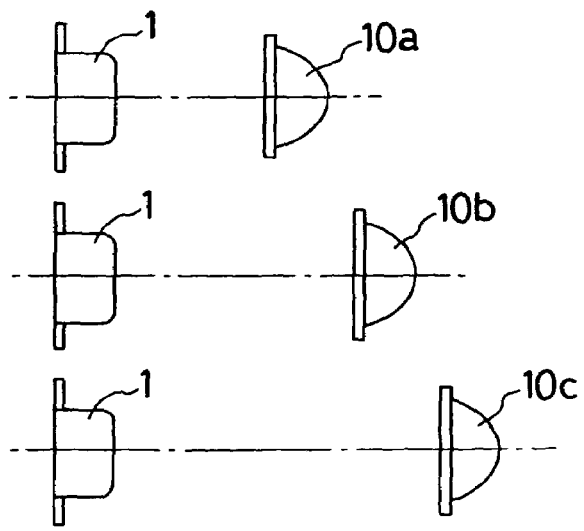
FIG. 9 is an explanatory drawing showing a typical configuration of the headlamp light when a plurality of LED lamps for the light source of the headlamp and projection lenses are combined.

FIG. 9 shows a schematic representation of another embodiment of a headlamp lamp using an LED lamp 1 as a light source according to the present invention. FIG. 4 showed an illumination-lamp configuration comprising a single LED lamp 1 and a single projection lens 10; however, while the white LED light emission portion 8 containing the shielding member 7 satisfies the regulations for the passing light distribution pattern HB in terms of shape, the illumination distribution provides insufficient central illumination and other similar regulations may not be satisfied.

Here, as the white LED light emission portion 8 with an extremely small surface area is directly projected in the present invention, the projection lens 10 may also be small. Accordingly, even if a plurality of combinations of an LED lamp 1 and the projection lens 10 are provided, the dimensional requirements for a headlamp can be satisfied.

Accordingly, this embodiment sets the plurality of combinations of the LED lamp 1 and the projection lens 10 to, for example, three for a single illumination lamp. In this case, the LED lamp 1 can be from the same one used in the previous embodiment. However, as for the projection lens 10, a No. 1 projection lens 10a with a same magnification as the projection lens 10 used in the FIG. 4, a No. 2 projection lens 10b with a reduced magnification, and a No. 3 projection lens 10c with a further reduced magnification are provided. All of these projection lenses perform projection in the same direction.

Figure 10:
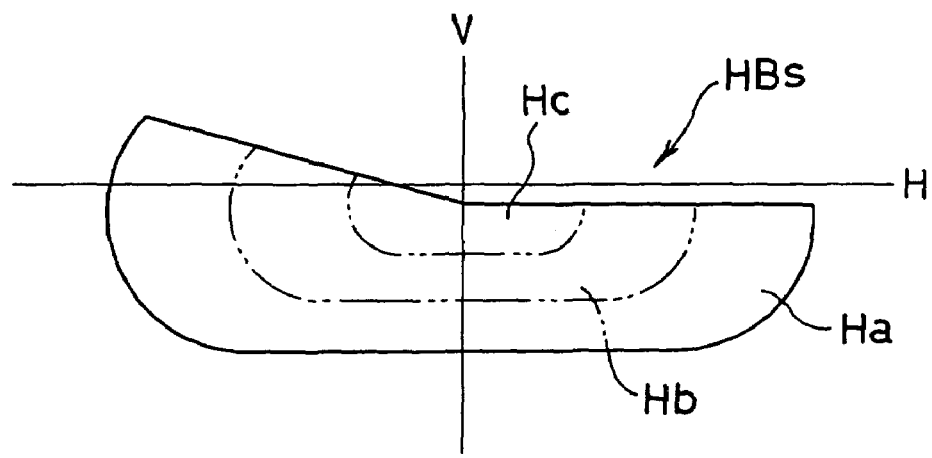
FIG. 10 is an explanatory drawing showing a typical shaping method for a light distribution characteristic when a plurality of LED lamps for the light source of the headlamp and projection lenses are combined.

FIG. 10 shows the passing light distribution pattern HBs obtained from a headlamp configured as explained above. Although this passing light distribution pattern HBs is same to the passing light distribution pattern 1B (see FIG. 3) from the previous embodiment in terms of shape, it is formed into a prescribed shape by superimposing the light distribution pattern Ha from the No. 1 projection lens 10a, the light distribution pattern Hb from the No. 2 projection lens 10b, and the light distribution pattern Hc from the No. 3 projection lens 10a–c.

Accordingly, the light distribution pattern Hc from the No. 3 projection lens 10c having the lowest magnification is the brightest. Moreover, by disposing this light distribution pattern Hc in the central area of the passing light distribution pattern HBs, illumination for the front direction of a vehicle becomes brightest and long-distance visibility is improved. Furthermore, regulations can be satisfied by adjusting the multiplicity of combinations of an LED lamp 1 and a projection lens 10 and the magnification of the corresponding projection lenses 10c.

In general, the quantity of light obtained from the LED lamp 1 is small in comparison with that of the halogen bulbs and metal halide discharged lamps used as light sources in the prior art. Therefore, such a method of increasing the number of combinations and the quantity of light is very effective as a means of realizing the headlamp using the LED lamp 1 as a light source.

In order to simplify the above explanation, the embodiment obtains the final passing light distribution pattern by superimposing a plurality of light distribution patterns having a substantially identical shape and different magnifications. However, the final passing light distribution pattern may be formed by joining a plurality of elements suitably dividing the shape of the final passing light distribution pattern. In other words, it is sufficient to ultimately obtain the light distribution pattern that satisfies the regulations.

Figure 11:
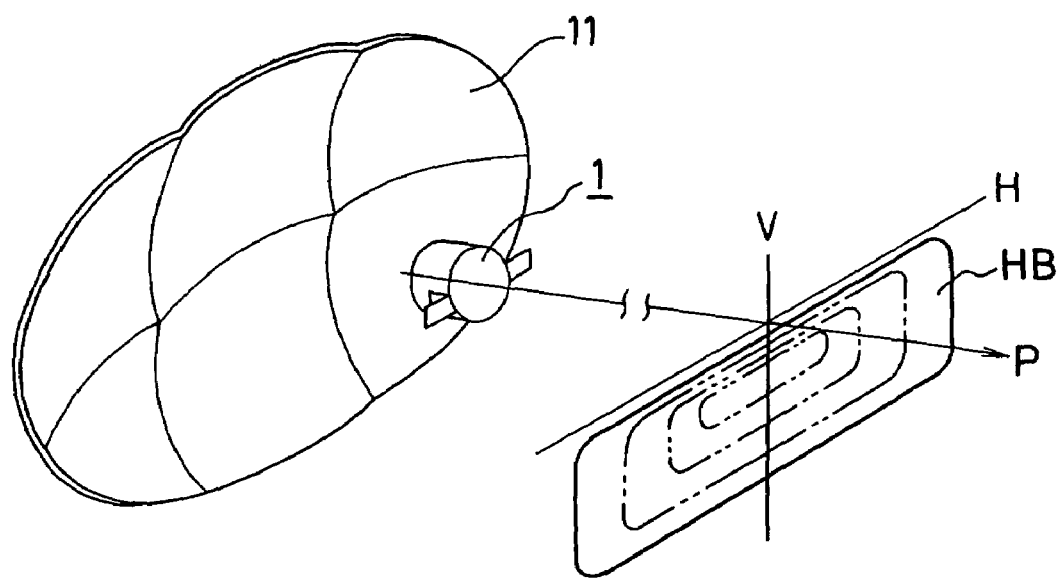
FIG. 11 is an explanatory drawing showing a configuration when the LED lamp for the light source of a headlamp according to the present invention is combined with a reflector.

FIG. 11 shows an example of another projection method using the LED lamp 1 according to the present invention. In this example, projection in the illumination direction P is carried out using, for example, a reflector 11 having a paraboloid of revolution shape or another similar shape having a focus instead of the projection lens 10 constituting the previous projection means, thus realizing an illumination light with the prescribed light distribution pattern.

Accordingly, this projection method using the reflector 11 forming a projection image using the reflected light disposes the LED chip 2, the fluorophor 5, the shielding member 7, and the like in opposition to the reflector, or in other words, the parts are disposed in proximity thereto facing approximately backward with respect to the illumination direction P.

If this reflector 11 is, for example, a multi-reflector combining a plurality of parabolic adjustable surfaces, a high degree of freedom is achieved when forming the passing light distribution pattern HB, and since the chromatic aberration does not fundamentally occur in the reflector 11, the high quality passing light distribution pattern HB can be easily obtained. Furthermore, as in the case of the projection lens explained above, a plurality of combinations of the LED lamp 1 and the reflector 11 can be used in the realization of the headlamp.

As explained above, the present invention realizes an LED lamp for a light source of a headlamp disposing an LED chip in the vicinity of the focus of a projection means and providing a shielding member covering a portion of the LED chip in a formation allowing a light distribution characteristic suitable for a headlamp of a vehicle to be obtained when light from the LED chip is magnified and projected in an illumination direction by the projection means. Accordingly, light distribution shapes with accurate characteristics can be obtained in an extremely simple manner by projecting the shape of the light emission portion of the solid construction constituted by the LED lamp for a light source of a headlamp in the illumination direction using a projection lens or a reflector, and thus, exceptional advantages are achieved in the form of reliability improved by the solid state light source, cost reduction by the simplified construction, and the ability for compact designs.

While the presently preferred embodiment of the present invention has been shown and described, it will be understood that the present invention is not limited thereto, and that various changes and modification may be made by those skilled in the art without departing from the scope of the invention as set forth in the appended claims.

What is claimed is:

1. An LED lamp for a light source of a headlamp having a projection means which has a focus, characterized in a combination of a light source selected from the groups consisting of an LED chip and a white LED light emitter, and a fluorophor, the light source and fluorophor disposed in the vicinity of the focus of the projection means, and a shielding member covering a portion of said light source in a shape allowing a light distribution characteristic suitable for a headlamp of a vehicle to be obtained when light from said light source is magnified and projected in an illumination direction by said projection means;

wherein a surface of said shielding member opposing the light source has a mirror finish that is inclined for reflecting light in the direction of a non-shielded portion of the light source.

2. The LED lamp for the light source of the headlamp of claim 1, further characterized in that said shielding member is disposed to form a gap of 2 mm or less from said light source.

3. The LED lamp for the light source of headlamp of claim 1 or 2, further characterized in that said shielding member shields the portion of said light source in which highest intensity occurs or of an edge in the vicinity thereof.

4. The LED lamp for the light source of headlamp of claim 1 or 2, further characterized in that a wavelength conversion member is interposed between said light source and said shielding member.

5. The LED lamp for the light source of the headlamp of claim 1 or 2, further characterized in that a lens member or window glass member covering said light source is integrated with said shielding member.

* * * * *